United States Patent
Xu et al.

(10) Patent No.: US 9,704,855 B2
(45) Date of Patent: Jul. 11, 2017

(54) INTEGRATION OF ACTIVE POWER DEVICE WITH PASSIVE COMPONENTS

(71) Applicant: CoolStar Technology, Inc., Sunnyvale, CA (US)

(72) Inventors: Shuming Xu, Sunnyvale, CA (US); Wenhua Dai, San Jose, CA (US)

(73) Assignee: CoolStar Technology, Inc., Sunnyvale, CA (US)

( * ) Notice: Subject to any disclaimer, the term of this patent is extended or adjusted under 35 U.S.C. 154(b) by 0 days.

(21) Appl. No.: 14/948,449

(22) Filed: Nov. 23, 2015

(65) Prior Publication Data
US 2017/0148784 A1    May 25, 2017

(51) Int. Cl.
| | |
|---|---|
| *H01L 21/8234* | (2006.01) |
| *H01L 29/78* | (2006.01) |
| *H01L 27/06* | (2006.01) |
| *H01L 29/66* | (2006.01) |
| *H01L 49/02* | (2006.01) |
| *H01L 23/64* | (2006.01) |

(52) U.S. Cl.
CPC ...... *H01L 27/0629* (2013.01); *H01L 21/8234* (2013.01); *H01L 23/645* (2013.01); *H01L 28/10* (2013.01); *H01L 28/60* (2013.01); *H01L 29/66484* (2013.01); *H01L 29/66681* (2013.01); *H01L 29/7817* (2013.01); *H01L 29/7831* (2013.01)

(58) Field of Classification Search
None
See application file for complete search history.

(56) References Cited

U.S. PATENT DOCUMENTS

| | | | | |
|---|---|---|---|---|
| 5,539,241 | A | * | 7/1996 | Abidi ............... H01L 23/645 257/516 |
| 5,900,657 | A | * | 5/1999 | Merrill ............. H03K 17/162 257/296 |

(Continued)

OTHER PUBLICATIONS

Ya-Hong Xie, et al., "An Approach for Fabricating High-Performance Inductors on Low-Resistivity Substrates," IEEE Journal of Solid-State Circuits, vol. 33, No. 9, Sep. 1998, pp. 1433-1438.

(Continued)

*Primary Examiner* — Michael Lebentritt
*Assistant Examiner* — Jordan Klein
(74) *Attorney, Agent, or Firm* — Otterstedt, Ellenbogen & Kammer, LLP

(57) ABSTRACT

A method of integrating at least one passive component and at least one active power device on a same substrate includes: forming a substrate having a first resistivity value associated therewith; forming a low-resistivity region having a second resistivity value associated therewith in the substrate, the second resistivity value being lower than the first resistivity value; forming the at least one active power device in the low-resistivity region; forming an insulating layer over at least a portion of the at least one active power device; and forming the at least one passive component on an upper surface of the insulating layer above the substrate having the first resistivity value, the at least one passive component being disposed laterally relative to the at least one active power device and electrically connected with the at least one active power device.

20 Claims, 10 Drawing Sheets

(56) References Cited

U.S. PATENT DOCUMENTS

| | | | | |
|---|---|---|---|---|
| 6,337,253 B1* | 1/2002 | Davari | H01L 29/66181 | 257/E21.396 |
| 6,890,804 B1* | 5/2005 | Shibib | H01L 29/41741 | 257/336 |
| 8,987,820 B1* | 3/2015 | Lee | H01L 29/7816 | 257/335 |
| 2004/0198253 A1* | 10/2004 | Kondo | H01L 23/5223 | 455/91 |
| 2008/0029907 A1* | 2/2008 | Koduri | H01F 17/045 | 257/784 |
| 2008/0042236 A1* | 2/2008 | Seah Teo Leng | H01L 21/76838 | 257/531 |
| 2009/0014837 A1* | 1/2009 | Park | H01L 27/0617 | 257/536 |
| 2010/0171543 A1* | 7/2010 | Korec | H01L 23/49524 | 327/436 |
| 2011/0049584 A1* | 3/2011 | Momo | H01L 27/0629 | 257/288 |
| 2014/0002187 A1* | 1/2014 | McPartlin | H01L 29/7378 | 330/250 |
| 2015/0048481 A1* | 2/2015 | Hashimoto | H01L 23/585 | 257/531 |
| 2016/0268361 A1* | 9/2016 | Wang | H01L 27/3246 | |

OTHER PUBLICATIONS

A. Polyakov, et al., "High-Resistivity Polycrystalline Silicon as RF Substrate in Wafer-Level Packaging," Electronics Letters, vol. 41, No. 2, Jan. 2005, pp. 100-101.

* cited by examiner

INTEGRATION OF ACTIVE POWER DEVICE WITH PASSIVE COMPONENTS

FIELD

The present invention relates generally to integrated circuit (IC) structures, and more particularly to semiconductor devices and methods for integrating active power devices with passive components.

BACKGROUND

The increasing demand for high-bandwidth mobile applications, such as, but not limited to, smart phones, tablets, wireless networks and the like, has created a need for high-frequency (e.g., about 500 MHz and above), relatively high-power (e.g., about 30 to 250 watt) devices, such as, but not limited to, power amplifiers.

High-frequency power amplifiers are dominated by devices based on wide bandgap material substrates, such as, for example, gallium arsenide (GaAs). One advantage of using GaAs as a substrate, as compared to silicon for example, is the inherently high carrier mobility and low parasitic capacitance, making it well-suited for high-frequency operation. However, aside from the increased cost of GaAs, one drawback for GaAs devices is that GaAs fabrication is generally not compatible with a traditional silicon fabrication process. Hole mobility in a GaAs process is lower compared to a silicon process, thereby resulting in lower performance P-channel GaAs devices relative to corresponding P-channel devices formed in silicon. Moreover, because GaAs has high impurity densities, it is difficult to fabricate small structures in a GaAs process. Consequently, integrating GaAs power transistors with other devices on the same die poses a significant challenge.

SUMMARY

One or more embodiments of the invention provide techniques for fabricating a semiconductor structure including at least one active semiconductor device integrated with at least one passive component on the same substrate.

In accordance with one embodiment, a method of integrating at least one passive component and at least one active power device on a same substrate includes: forming a substrate having a first resistivity value associated therewith; forming a low-resistivity region having a second resistivity value associated therewith in the substrate, the second resistivity value being lower than the first resistivity value; forming the at least one active power device in the low-resistivity region; forming an insulating layer over at least a portion of the at least one active power device; and forming the at least one passive component on an upper surface of the insulating layer above the substrate having the first resistivity value, the at least one passive component being disposed laterally relative to the at least one active power device and electrically connected with the at least one active power device.

In accordance with another embodiment, a semiconductor structure comprises at least one active power device, the active power device including a substrate of a first conductivity type, source and drain regions of a second conductivity type formed in the substrate, the source and drain regions being spaced laterally from one another, a first gate disposed above at least a portion of the substrate, between the source and drain regions, and a second gate disposed at least partially over the first gate and electrically insulated from the first gate. The second gate is configured to control an operational mode of the active power device. The semiconductor structure further includes an integrated capacitor including top and bottom parallel plates. A source plane overlying at least a portion of the source region and electrically connected therewith forms the bottom plate. The top plate is formed as a conductive structure disposed above at least a portion of the source plane and electrically insulated from the source plane by a dielectric layer formed over the source plane. The top plate is electrically connected with the second gate.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. Where an actor facilitates an action by other than performing the action, the action is nevertheless performed by some other entity or combination of entities.

Techniques according to embodiments of the present invention provide substantial beneficial technical effects. By way of example only and without limitation, one or more embodiments may provide one or more of the following advantages, among other benefits:

- a laterally-diffused metal oxide semiconductor field-effect transistor (LDMOSFET) structure with integrated source bypass capacitor for reducing the parasitic impedance associated with a field plate shielding structure included in the LDMOSFET device, which improves the RF performance of the device;
- an LDMOSFET device structure including an integrated source bypass capacitor that can be precisely tuned by varying a size of the plate to achieve a desired capacitance value tailored to different device design and circuit requirements so as to minimize the parasitic impedance and RF noise;
- an LDMOSFET device structure including an integrated source bypass capacitor and a field plate shielding structure configured as a second gate, wherein a bias voltage applied to the second gate is used to control an operational mode of the LDMOSFET device to further improve the performance of the device;
- an LDMOSFET device including an integrated passive inductor to achieve precise on-die matching which cannot otherwise be achieved using discrete devices due at least in part to inherent variation in parasitic inductance and capacitance associated with the LDMOSFET device and inductor;
- improved performance from the integrated source inductors at least in part because vertical wires connecting to inductors located above and/or below the LDMOSFET device provides a shorter path, and thus reduced parasitic impedance, compared to using inductors not integrated with the LDMOSFET device;
- improved stability, gain and efficiency of an amplifier using the novel LDMOSFET device with integrated passive inductor(s).

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
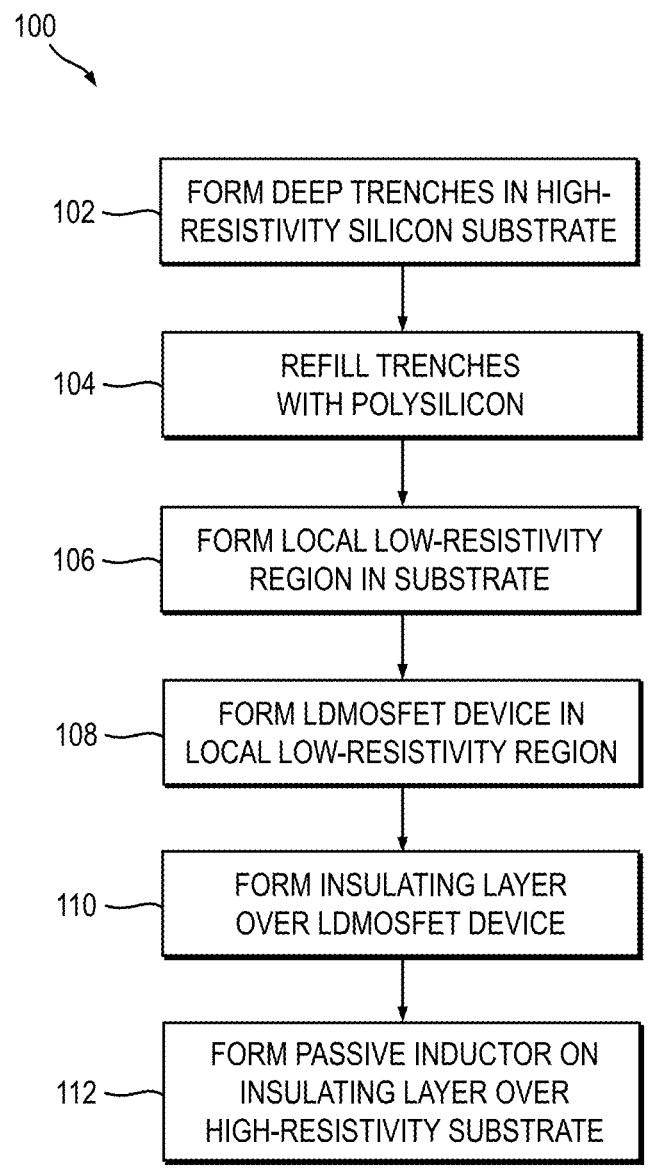
FIG. 1 depicts at least a portion of an exemplary method for forming a semiconductor structure including an active power semiconductor device and a passive component integrated on the same substrate, according to an embodiment of the invention.
Figure 2:
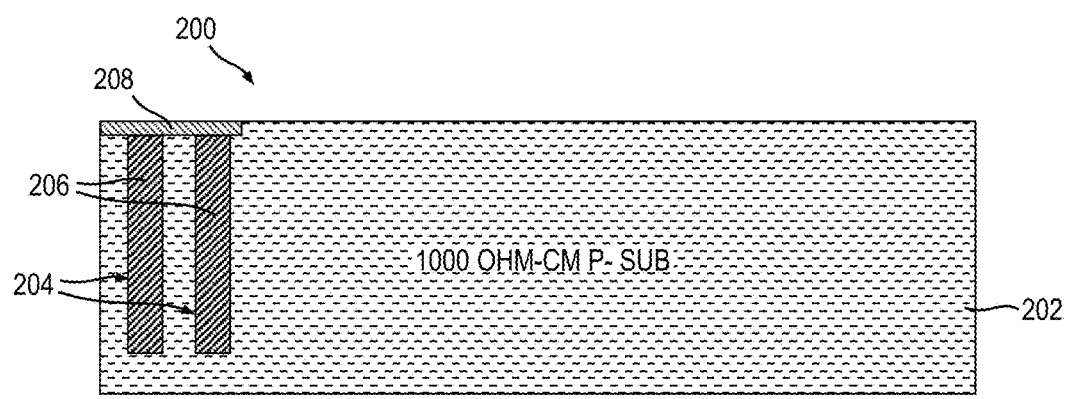
FIGS. 2 through 5 are cross-sectional views depicting intermediate processing steps in an overall semiconductor fabrication methodology for integrating an active power semiconductor device with a passive component, according to an embodiment of the invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative methods for fabricating a silicon-based P-channel laterally diffused (LD) metal-oxide-semiconductor field-effect transistor (MOSFET) on the same substrate as a passive inductor, and the semiconductor devices formed thereby. It is to be appreciated, however, that the invention is not limited to the specific methods and/or devices illustratively shown and described herein. Rather, aspects of the present disclosure relate more broadly to a semiconductor structure and techniques for integrating at least one active power semiconductor device with at least one passive component on the same substrate in a manner that achieves superior performance and reduced cost compared to standard fabrication methodologies. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

For the purpose of describing and claiming embodiments of the invention, the term MISFET as may be used herein is intended to be construed broadly and to encompass any type of metal-insulator-semiconductor field-effect transistor. The term MISFET is, for example, intended to encompass semiconductor field-effect transistors that utilize an oxide material as their gate dielectric (i.e., MOSFETs), as well as those that do not. In addition, despite a reference to the term "metal" in the acronyms MISFET and MOSFET, the terms MISFET and MOSFET are also intended to encompass semiconductor field-effect transistors wherein the gate is formed from a non-metal such as, for instance, polysilicon; the terms "MISFET" and "MOSFET" are used interchangeably herein.

Embodiments of the present invention described herein include at least one active semiconductor device, such as, for example, one or more P-channel MISFETs (hereinafter called "PFETs") and/or one or more N-channel MISFETs (hereinafter called "NFETs"), integrated with at least one passive component, such as, for example, an inductor, using a complementary metal-oxide-semiconductor (CMOS) fabrication process. It is to be appreciated that the invention is not limited to such active devices and passive components and/or such a fabrication process, and that other suitable active devices (e.g., diodes), passive components and/or fabrication processes (e.g., BiCMOS, etc.), may be similarly employed, as will be understood by those skilled in the art given the teachings herein.

As previously stated, power devices which utilize a GaAs process cannot be readily integrated with passive components, such as inductors. Monolithic planar inductors formed on a GaAs substrate are usually of very low performance; for instance, the quality factor (Q) of a planar inductor, which is dominated by the geometrics and process parameters of the inductor, formed on GaAs is generally low (e.g., less than about 15). This low Q is due, at least in part, to the inherently low resistivity of the GaAs material. In the context of an inductor, Q-factor is typically defined as the ratio of stored energy to dissipated energy in the inductor. Low Q-factor translates to high loss and wide bandwidth, while high Q-factor means low loss and high selectivity, with the latter generally being more desirable from a performance perspective.

There are two main types of losses affecting the performance of an integrated inductor; namely, resistive loss and capacitive loss. Resistive loss is inversely proportional to the inductor coil width; that is, the larger the coil width, the larger the cross section that current flows through and hence the lower the resistivity. In order to reduce resistive loss, coil width should be as large as possible. In a capacitive loss mechanism, parasitic capacitance, resulting primarily from capacitive coupling between the inductor coils and the wafer substrate, increases with increasing inductor coil width; that is, capacitive loss is proportional to the coil area. In order to reduce capacitive loss, the coil width should be as small as possible. Consequently, the mechanisms for reducing resistive and capacitive losses are mutually exclusive.

For monolithic spiral inductors with the same track width, more turns will result in a lower maximum Q-factor. This is because increased turn numbers mean increased resistance due to eddy currents and increased metal length. Likewise, for those inductors with the same number of turns, larger track width will result in lower maximum Q-factor. This is because the capacitive coupling between spiral turns and substrate capacitance both increase accordingly, which will result in more energy being stored in electric form, which is counterproductive to increasing inductor Q-factors.

One way to fabricate a monolithic passive inductor having an increased Q-factor is to utilize a high-resistivity substrate, for example on the order of about 200 ohm-centimeter ($\Omega$-cm) or higher. High-resistivity substrates are advantageous for forming passive components because they reduce capacitive (electrostatic) and electromagnetic coupling between the substrate and the passive components, among other benefits. However, high-resistivity substrates are generally not suitable for use in forming high-frequency radio frequency (RF) devices. For power semiconductor devices, a low-resistivity substrate reduces resistive heat generation, an important factor in the formation of such devices. Moreover, high-power CMOS (e.g., RF power amplifiers, etc.) typically uses highly doped substrates with a thin epitaxial layer to ensure latch-up immunity at tight design rules; the resistivity of the substrate is on the order of about 0.01 $\Omega$-cm. Consequently, integrating passive components with active RF power devices is extremely challenging, as the two types of components have mutually exclusive design criteria.

According to one or more embodiments of the invention, a high-resistivity substrate is utilized for forming passive components, such as, for example, inductors, and a low-resistivity region is utilized for forming active power semiconductor devices, such as, for example, power amplifiers. Specifically, in one or more embodiments a high-resistivity substrate (e.g., about 200 $\Omega$-cm or higher) is provided in which a prescribed region of the substrate is locally doped to form a low-resistivity (e.g., about 0.01 $\Omega$-cm) region of the substrate. Active power devices (e.g., LDMOSFETs) are formed in the local low-resistivity region of the substrate and the passive components are formed in the remaining high-resistivity portion of the substrate. In this manner, the respective resistivities of the different substrate regions can be tailored according to the type of devices formed therein.

FIG. 1 shows a flow diagram of at least a portion of an exemplary method 100 for integrating an active power device, an LDMOSFET device in this illustration, and a passive inductor on the same substrate, in accordance with an embodiment of the invention. FIGS. 2-5 are cross-sectional views depicting at least a portion of intermediate stages during the fabrication of an exemplary semiconductor structure 200 which includes a passive component integrated with an active power device on the same substrate, according to one or more embodiments of the invention.

Although the overall fabrication method and structures formed thereby are entirely novel, certain individual processing steps required to implement a portion or portions of the method may utilize conventional semiconductor fabrication techniques and conventional semiconductor fabrication tooling. These techniques and tooling will already be familiar to one having ordinary skill in the relevant arts. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are hereby incorporated by reference herein. It is emphasized that while some individual processing steps are set forth herein, those steps are merely illustrative and one skilled in the art may be familiar with several equally suitable alternatives that would also fall within the scope of the present invention.

It is to be understood that the various layers and/or regions shown in the accompanying figures are not necessarily drawn to scale. Furthermore, one or more semiconductor layers of a type commonly used in such integrated circuit devices may not be explicitly shown in a given figure for economy of description. This does not imply, however, that the semiconductor layer(s) not explicitly shown are omitted in the actual integrated circuit device.

With reference to FIGS. 1 through 5, the illustrative method 100 starts with a lightly-doped, high-resistivity substrate 202. For example, in one or more embodiments, a substrate having a resistivity in a range of about 200 $\Omega$-cm to about 10,000 $\Omega$-cm is used, although embodiments of the invention are not limited to any specific value or range of resistivity. The substrate 202, in one or more embodiments, is formed of single-crystalline silicon (e.g., having a <100> or <111> crystal orientation), although suitable alternative materials may also be used, such as, but not limited to, germanium, silicon germanium, silicon carbide, gallium arsenide, gallium nitride, or the like. Additionally, in one or more embodiments the substrate 202 is preferably modified by adding an impurity or dopant (e.g., boron, phosphorus, arsenic, etc.) to change a conductivity of the material (e.g., N-type or P-type). In one or more embodiments, the substrate 202 is of P-type conductivity and may thus be referred to as P-substrate (P-SUB). A P-substrate may be formed by adding a P-type impurity or dopant (e.g., Group III elements, such as boron) of a prescribed concentration level (e.g., about $10^{14}$ about $10^{19}$ atoms per cubic centimeter) to the substrate material, such as by using a diffusion or implant step, to change the conductivity of the material as desired. In one or more alternative embodiments, an N-substrate may be formed by adding an N-type impurity or dopant (e.g., Group V elements, such as phosphorus) of a prescribed concentration level to the substrate material. As previously stated, one or more embodiments utilize a lightly-doped substrate such that the resistivity is above a prescribed value (e.g., greater than about 200 $\Omega$-cm); the higher the impurity doping level, the lower the resistivity, and vice versa.

In step 102, deep trenches 204 are formed partially through the high-resistivity substrate 202. The trenches are formed, in one or more embodiments, using standard lithographic patterning and etching on what will become a source side of the active power device. For example, a hard mask layer (not explicitly shown in FIG. 2) is formed on at least a portion of an upper surface of the wafer and etched for patterning defined portions of the substrate in a subsequent lithographic process. In one or more embodiments, the hard mask layer is formed of silicon nitride which is deposited on the upper surface of the wafer using, for example, chemical vapor deposition (CVD), although other materials and processes for forming the hard mask layer are similarly contemplated by and fall within the scope of embodiments of the invention. The trenches 204 are etched, as defined by exposed portions of the hard mask layer, partially through the substrate 202. In one or more embodiments, a depth of the trenches 204 is in a range of about 50 microns ($\mu$m) to about 100 $\mu$m, although embodiments of the invention are not limited to any specific depth of the trenches.

In step 104, the trenches 204 are refilled with a conductive material 206. In one or more embodiments, the conductive material 206 used to refill the trenches 204 comprises heavily-doped N-type polysilicon, although alternative materials are also contemplated, such as, but not limited to, P-type polysilicon, tungsten, etc. A sheet resistance of the conductive material 206 is in a range of about 0.001 to about 0.5 ohm-cm, in one or more embodiments. The conductive material 206 is formed in the trenches 204, for example by ion implantation, chemical vapor deposition (CVD) or physical vapor deposition (PVD) sputtering. Excess conductive material 206 and hard mask material on the upper surface of the wafer are then removed using a planarization technique such as, for example, chemical-mechanical polishing (CMP). A conductive layer 208 is then formed on at least a portion of the upper surface of the wafer over and in electrical contact with the conductive material 206 in the trenches 204.

The deep trenches 204 can ultimately be used, in one or more embodiments, to provide an electrical connection with a source region of the active power semiconductor device (e.g., through a back-side contact of the wafer 200). Conventionally, a low-resistivity substrate is used and therefore electrical connection between the active power device and the back-side contact of the wafer is made directly through the substrate itself, which generally has a resistivity on the order of about 0.01 Ω-cm. In one or more alternative embodiments, electrical connection between the active power device and an external source contact is made through the upper surface of the wafer, and thus the deep trenches 204, as well as the back-side contact, may be eliminated, as will be described in further detail herein below.

Figure 3:
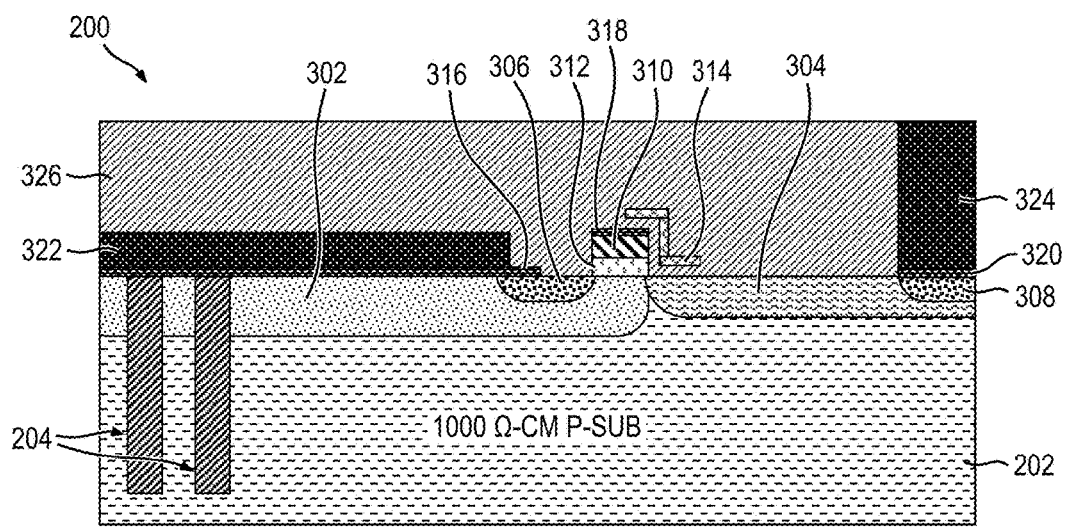

In step 106, after deep trench formation, a local low-resistivity region 302 is formed in at least a portion of the high-resistivity substrate 202. One or more active devices (e.g., LDMOSFET, diode, etc.) are subsequently formed in this low-resistivity region 302 in step 108. As shown in FIG. 3, the low-resistivity region 302 comprises a P-type well (or P-well) disposed proximate an upper surface of the substrate 202. The P-well 302 is electrically connected with the trenches 204 and extends laterally away from the trenches 204 towards what will become a drain side of the device. In the illustrative embodiment of FIG. 3, the P-well 302 is formed by implanting a P-type impurity (e.g., boron) into a defined area of the substrate 202 using standard CMOS fabrication techniques. The P-well 302 is preferably more heavily doped relative to the doping level of the substrate 202, such that the P-well has a lower resistivity than the substrate, such as, for example 0.2 Ω-cm. In one or more alternative embodiments where an N-type substrate 202 is employed, the low-resistivity region 302 may comprise an N-type well that is formed using similar CMOS fabrication techniques.

A drain extension region 304 is formed in the substrate 202, proximate the upper surface thereof, and is substantially vertically aligned with an edge of the low-resistivity region 302 at one end; an opposite end of the drain extension region 304 extends laterally away from the low-resistivity region 302 (i.e., towards a drain side of the device). In one or more embodiments, the drain extension region 304 is of N-type conductivity, formed by implanting an N-type impurity (e.g., phosphorus) into a defined area of the substrate using standard CMOS fabrication techniques. The drain extension region 304 is preferably lightly doped. The doping concentration of the drain extension region 304 is strongly correlated with breakdown voltage of the LDMOSFET device, and thus by controlling the doping level of the drain extension region 304, among other factors, a desired breakdown voltage can be achieved in the device.

First and second heavily-doped regions of opposite conductivity (e.g., N-type) relative to the substrate 202 represent a source region 306 and drain region 308, respectively, of the LDMOSFET device. In one or more embodiments, the source and drain regions 306, 308 are comprised of heavily-doped N-type material formed using a standard CMOS implant process. Specifically, standard CMOS fabrication technology may implant the source region 306 and the drain region 308 with N-type material to form a first N+ region corresponding to the source region 306 and a second N+ region corresponding to the drain region 308. The N-type material includes impurity atoms of a donor type, such as, but not limited to, phosphorus, arsenic, antimony, or the like, that are capable of donating an electron. Implanting the source region 306 and/or the drain region 308 with the N-type material causes the carrier electron density in the source region 306 and/or the drain region 308 to exceed a carrier hole density.

A gate 310 is formed above the low-resistivity region 302, proximate the upper surface of the wafer and between the source and drain regions 306, 308. The gate 310 is electrically isolated from the low-resistivity region 302 by a thin insulating layer 312 on the upper surface of the wafer on which the gate is formed. The thin insulating layer 312 may, in some embodiments, be formed of an oxide (e.g., silicon dioxide), and may therefore be referred to herein as a gate oxide layer. The gate 310 is preferably formed of heavily-doped polysilicon, although other materials for forming the gate are similarly contemplated (e.g., a metal). When a voltage is applied between the gate 310 and source region 306, an inversion layer or channel is induced in the low-resistivity region 302 under the gate insulating layer 312, via a field effect principle; the channel is operative to conduct a current between source and drain regions of the device, as will be known by those skilled in the art.

In one or more embodiments, a shielding structure 314 is formed at least partially over the gate 310 and electrically insulated from the gate by a thin insulating layer (e.g., oxide). In the illustrative embodiment of FIG. 3, the shielding structure, also referred to as a Faraday shield, is formed as a stepped structure having a first end disposed over the gate 310 and electrically insulated therefrom, and a second end extending laterally from the first end and disposed over the drain extension region 304. In some embodiments (not explicitly shown in FIG. 3), the shielding structure 314 is electrically connected with the source region 306, such as by laterally extending a source contact 322 over the gate 310. The shielding structure 314 functions primarily to reduce feedback capacitance and to reduce threshold drift to provide superior linearity of the device. The shielding structure 314 also helps mitigate a high electric field which is often present at a gate edge on the drain side of the LDMOSFET, which can result in electron injection (hot carrier injection (HCI)) into the gate oxide 312 leading to threshold drift which deteriorates linearity.

In one or more embodiments, a layer of silicide, an alloy of metal and silicon, forms a low-resistance interconnection between the N-type LDMOSFET device and other devices fabricated on the substrate 202. The LDMOSFET device may include a first layer of silicide 316 adjacent to and extending laterally over at least a portion of a top surface of the source region 306 and at least a portion of a top surface of the low-resistivity region 302. Likewise, the LDMOSFET device may include a second layer of silicide 318 adjacent to the top surface of the gate 310. Similarly, the LDMOS- FET device may include a third layer of silicide 320 adjacent to at least a portion of a top surface of the drain region 308. The first layer of silicide 316, the second layer of silicide 318, and/or the third layer of silicide 320 preferably contact respective sides of the source region 306, the gate 310 and/or the drain region 308.

In one or more embodiments, a source contact 322 is formed on at least a portion of the first silicide layer 316. Likewise, a drain contact 324 is formed on at least a portion of the third silicide layer 320. The source and drain contacts 322, 324 provide electrical connection with the source and drain regions 306, 308, respectively, of the LDMOSFET device.

Using standard CMOS fabrication steps, once the front-end processing used to form the LDMOSFET device has been completed, the LDMOSFET device is interconnected with one or more components fabricated on the same wafer to form a desired electrical circuit. This occurs in a series of wafer processing steps collectively referred to as back-end-of-line (BEOL) processing. BEOL processing primarily involves creating metal interconnects that are isolated by insulating (i.e., dielectric) layers. The insulating material used to form the dielectric layers has traditionally been a form of silicon dioxide ($SiO_2$), although other materials are similarly contemplated by embodiments of the invention (e.g., silicate glass, etc.).

Figure 4:
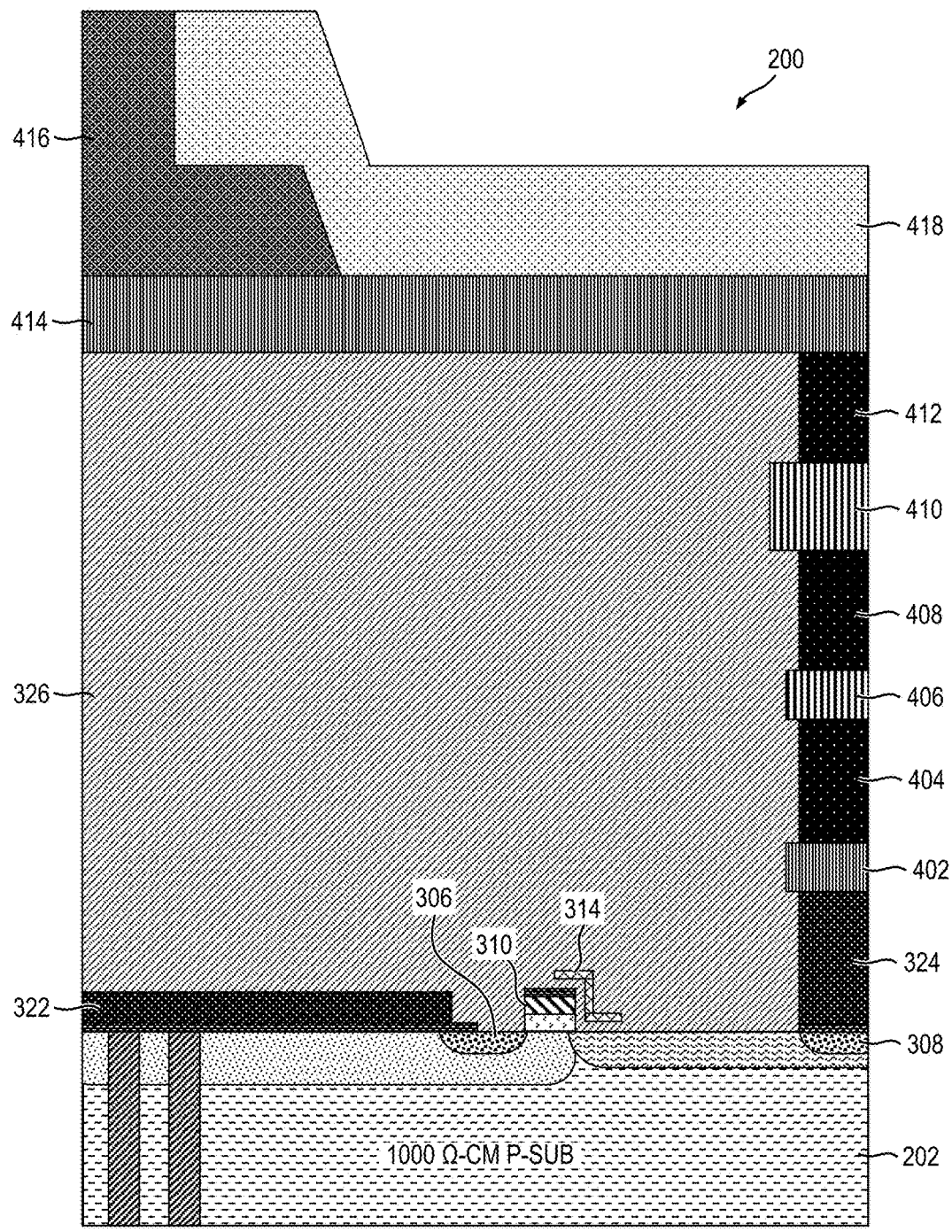

With reference to FIG. 4, formation of drain and source terminals of the LDMOSFET device are shown, according to an embodiment of the invention. A first metal wire 402 in a first metal layer (M1) is formed on and electrically connected with the drain contact 324. In one or more embodiments, the metal wire 402 is composed of aluminum. In this approach to wiring (often referred to as subtractive-aluminum wiring), a blanket film of aluminum is deposited first, patterned, and then etched, leaving isolated wires in the same plane of metal. Dielectric material (collectively forming an insulating layer 326) is then deposited over the exposed wire. Adjacent metal layers (that is, metal layers in vertically adjacent planes separated by dielectric material) are electrically interconnected by etching openings in the insulating layer 326 and then filling the openings with a conductive material, such as, for example, tungsten, to form vias. The openings are filled, in one or more embodiments, using a standard deposition technique, such as, for example, chemical vapor deposition (CVD).

More particularly, a first via (VIA1) 404 is formed in the insulating layer 326 on at least a portion of the metal wire 402 and electrically connected thereto. A second metal wire 406 in a second metal layer (M2) is formed on at least a portion of the first via 404 and electrically connected thereto. In this illustrative embodiment, the second metal wire 406 is composed of copper, although embodiments of the invention are not limited to copper. A second via (VIA2) 408 is then formed on at least a portion of the second metal wire 406 and electrically connected thereto. A third metal wire 410 in a third metal layer (M3) is formed on at least a portion of the second via 408 and electrically connected thereto. In this illustrative embodiment, the third metal wire 410 is composed of copper, although embodiments of the invention are not limited to copper. A third via (VIA3) 412 is formed on at least a portion of the third metal wire 410 and electrically connected thereto. A fourth metal wire 414 in a fourth metal layer (M4) is formed on at least a portion of the third via 412 and electrically connected thereto. In this illustrative embodiment, the fourth metal wire 412 is composed of aluminum, although embodiments of the invention are not limited to aluminum.

Once the final metal layer has been completed, a passivation layer 416 is preferably deposited over at least a portion of the upper surface of the wafer. In order to form a terminal (e.g., pad) for electrically contacting the LDMOSFET device, an opening or recess is formed in the passivation layer 416 to expose the underlying final metal wire 414. The opening may be formed using a standard patterning and etching process. A metallization layer 418 is then deposited within the opening. In one or more embodiments, the metallization layer 418 is formed using a standard redistribution layer (RDL) process.

Figure 5:
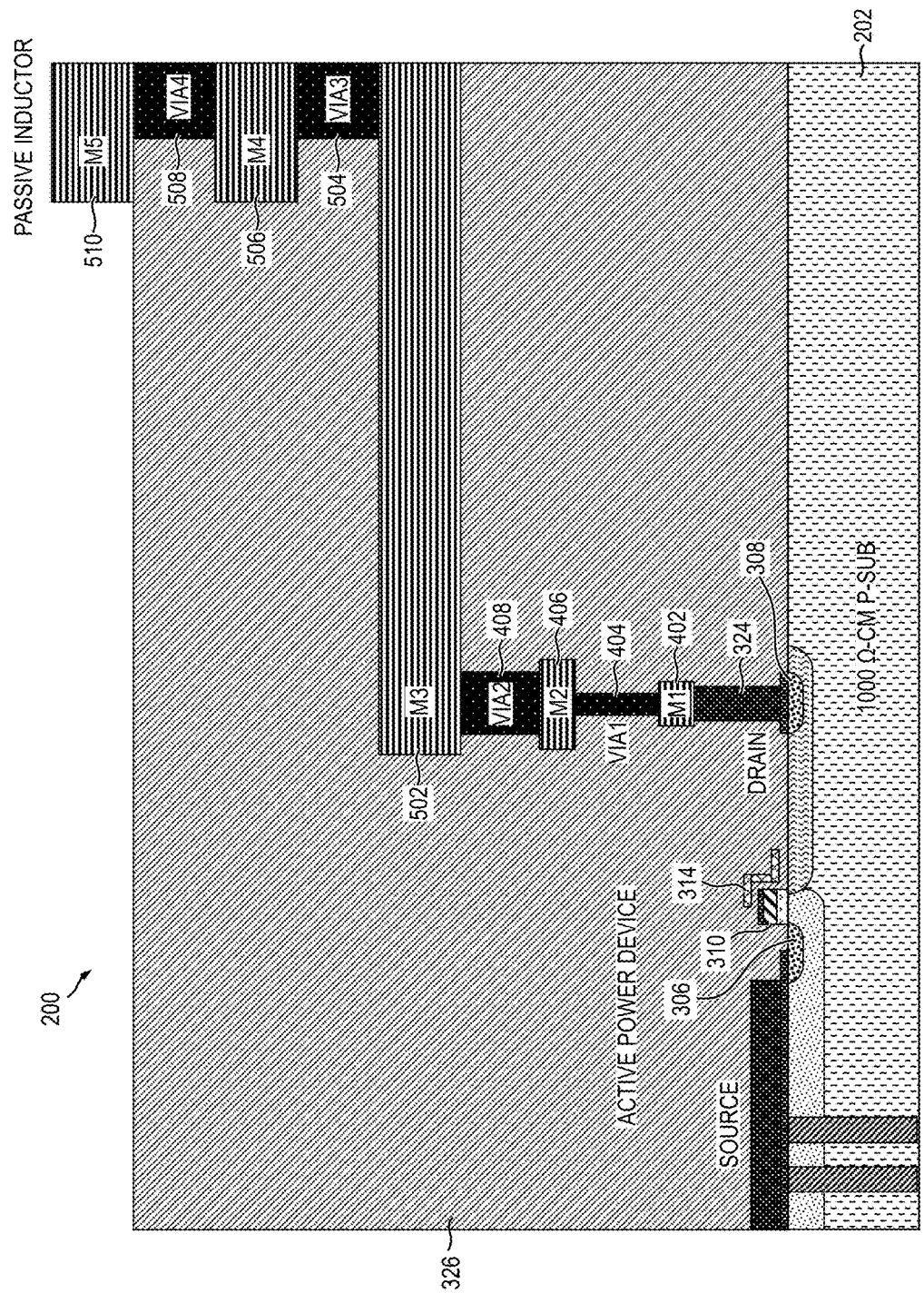

Once the primary process steps for forming the LDMOSFET device in the low-resistivity region 302 have been completed, one or more passive components, such as, for example, an inductor, are formed on the insulating layer 326 over the high-resistivity substrate 202 in step 112 of FIG. 1. FIG. 5 is a cross-sectional view depicting at least a portion of the semiconductor structure 200 including the active power LDMOSFET device connected to a passive inductor (e.g., a spiral inductor), according to an embodiment of the invention. To accomplish this, rather than forming the drain terminal of the LDMOSFET device on the upper surface of the wafer, as shown in FIG. 4, the third metal wire (410 in FIG. 4) is replaced by an M3 interconnect 502 formed on the second via (VIA2) 408. The M3 interconnect 502 is used to electrically connect the drain 308 of the LDMOSFET device, through the drain contact 324, first metal wire 402, first via 404, second metal wire 406 and second via 408, to a passive inductor through a third via (VIA3) 504 formed on the M3 interconnect 502, a fourth metal wire 506 formed in M4 on the third via 504, and a fourth via (VIA4) 508 formed on the fourth metal wire 506.

In this illustrative embodiment, the passive inductor is formed of metal tracks 510 in a fifth metal layer (M5), which is a final metal layer. The passive inductor, in one or more embodiments, comprises a spiral inductor that is preferably fabricated using the thickest metal available on the upper surface of the insulating layer 326. As previously stated, the passive inductor is formed over the high-resistivity substrate 202, laterally adjacent to a corresponding LDMOSFET device to which the inductor is connected, which reduces eddy currents in the M5 inductor tracks 510 as well as reducing substrate capacitance to thereby increase the Q-factor of the inductor.

In a vertical LDMOSFET device, a back-side contact 420 may be formed using BEOL processing, as shown in FIGS. 4 and 5. The back-side contact 420 is electrically connected with the deep trenches 204 and provides electrical connection to the source region 306 of the LDMOSFET device. In the case of a planar LDMOSFET device, the deep trenches 204 may be used to connect one or more passive components formed on the back side of the substrate 202 with the source of the LDMOSFET, as will be described in further detail in conjunction with FIG. 11.

In one or more embodiments, the back-side contact 420 is formed by first removing substrate material (e.g., silicon) on the back side of the wafer, also referred to as back-side silicon in the context of a silicon substrate, to thereby expose the conductive material (206 in FIG. 2) in the trenches through the back side of the wafer. Removal of the back-side silicon may be performed, in one or more embodiments, using a back-side grind, although alternative silicon removal techniques are similarly contemplated (e.g., etching). By way of example only, assuming a depth of the trenches 204 is 50 as measured down from the top surface of the substrate 202, the substrate would need to be thinned to less than 50 µm to expose the heavily-doped polysilicon in the trenches.

Likewise, if the trench depth is 100 μm, the substrate 202 would need to be thinned to less than 100 μm. Thus, to ensure structural integrity of the device, a prescribed minimum trench depth (e.g., about 50 μm) should be used.

After the substrate is thinned to thereby expose the conductive material in the trenches 204, metal is deposited on the back side of the wafer to form the back-side contact 420. In one or more embodiments, the back-side contact 420 is composed of aluminum which is deposited on the back side of the wafer using a standard deposition technique, such as, for example, CVD. It is to be appreciated, however, that suitable alternative materials (e.g., gold) and/or deposition processes (e.g., plating) may be similarly employed, in accordance with embodiments of the invention.

As an alternative approach to forming an electrical contact between the back-side of the wafer and the trenches 204, one or more trenches (not explicitly shown) can be etched through the back side of the wafer into the trenches 204. These back-side trenches are then filled with metal, or an alternative conductive material, to form metallic contacts with the trenches 204 to the back side of the wafer, as will become apparent to those skilled in the art given the teachings herein.

Figure 6:
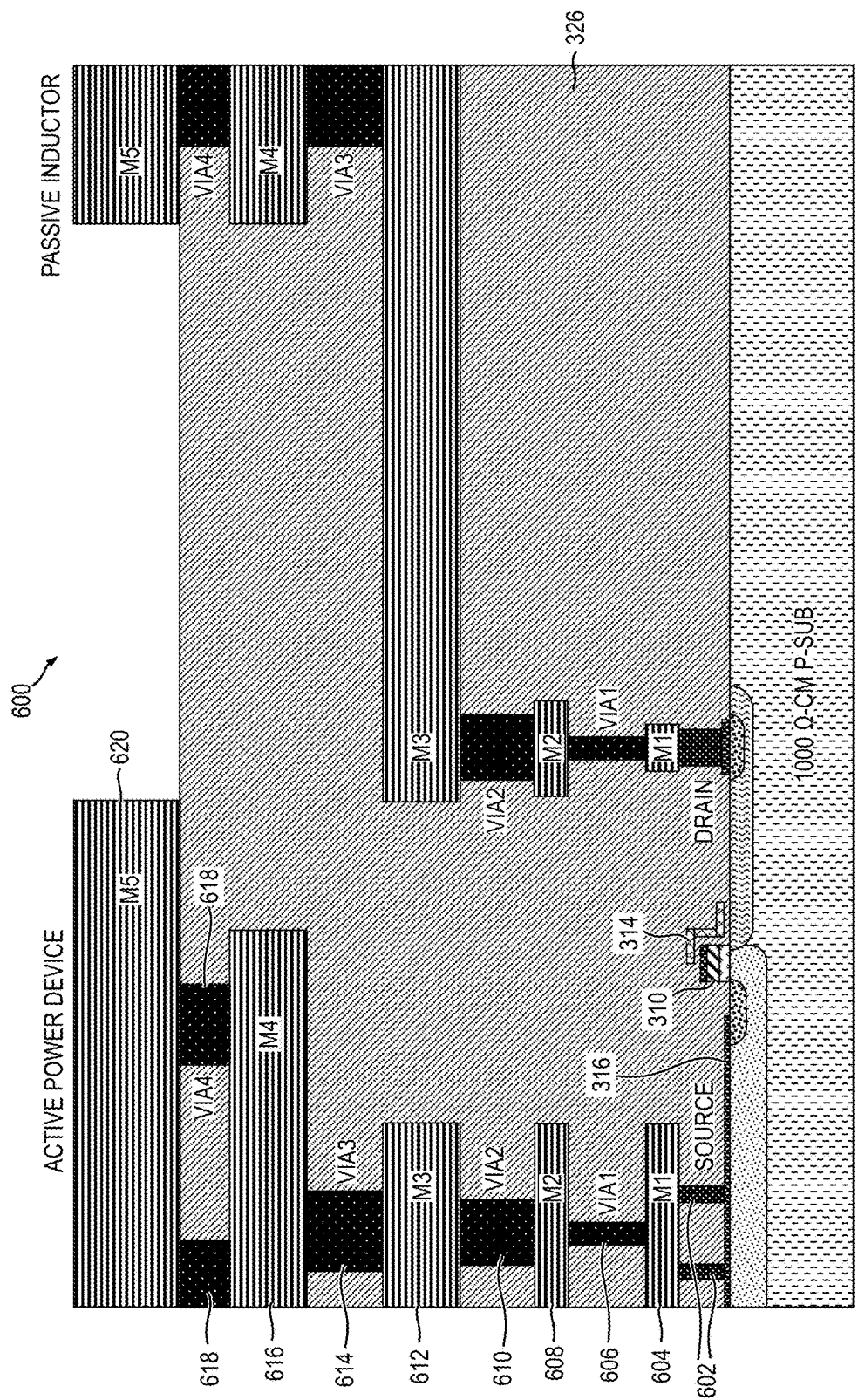
FIG. 6 is a cross-sectional view depicting at least a portion of an exemplary semiconductor structure including an active power semiconductor device and a passive component integrated on the same substrate, according to an embodiment of the invention.

In one or more other embodiments, external contact with the source region 306 of the LDMOSFET device is made through the top surface of the semiconductor structure, rather than through the back-side of the wafer. In this configuration, the deep trenches 204 and back-side contact 420 can be eliminated. FIG. 6 is a cross-sectional view depicting at least a portion of an exemplary semiconductor structure 600 including an active power device and a passive component integrated on the same substrate which utilizes a top-side source contact, according to an alternative embodiment of the invention. Specifically, in this illustrative embodiment, the active power device comprises an LDMOSFET device having a source connection made through the upper surface of the semiconductor structure 600; the passive component comprises an inductor, such as a spiral inductor, formed in a manner consistent with the passive inductor shown in FIG. 5 and described herein above.

With reference now to FIG. 6, the source connection of the LDMOSFET device comprises a plurality of metal wires in adjacent metal layers formed throughout the insulating layer 326 using, for example, a subtractive-aluminum wiring process, a damascene copper process, or similar technique, much like the formation of the drain connection of the LDMOSFET device shown in FIG. 4. More particularly, a plurality of source contacts 602 are formed on at least a portion of the source silicide layer 316 which provides a low-resistance connection to the source region 306. In one or more embodiments, the source contacts 602 may be formed in a manner consistent with the source contact 322 shown in FIGS. 3 and 4, at least in terms of material and processing.

A first metal wire 604 in the M1 layer is formed on and electrically connected to the source contacts 602. In one or more embodiments, the metal wire 604 is composed of aluminum. A first via (VIA1) 606 is formed in the insulating layer 326 on at least a portion of the metal wire 604 and electrically connected thereto. A second metal wire 608 in the M2 layer is formed on at least a portion of the first via 606 and electrically connected thereto. A second via (VIA2) 610 is then formed on at least a portion of the second metal wire 608 and electrically connected thereto. A third metal wire 612 in the M3 layer is formed on at least a portion of the second via 610 and electrically connected thereto. A third via (VIA3) 614 is formed on at least a portion of the third metal wire 612 and electrically connected thereto. A fourth metal wire 616 in the M4 layer is formed on at least a portion of the third via 614 and electrically connected thereto. A plurality of fourth vias (VIA4) 618 are formed on at least a portion of the fourth metal wire 616 and electrically connected thereto.

A source connection 620 in the M5 layer is formed on the fourth vias 618 and electrically connected thereto. The source connection 620 is formed on the upper surface of the semiconductor structure 600 and provides an external electrical connection between the source of the LDMOSFET device and a ground or other voltage source. In one or more embodiments, the metal wires 604, 608, 612, 616 and 620 in the various metal layers (M1-M5) are formed of aluminum, and the vias 606, 610, 614 and 618 in the various via layers (VIA1-VIA4) are formed of tungsten. It is to be appreciated, however, that other materials for forming the metal wires and vias may be similarly employed in other embodiments.

The LDMOSFET structure is able to support high voltage. It is also able to work reliably to handle high current density. Unfortunately, when operated at high voltage, the LDMOSFET has a drawback of high knee voltage due to low carrier mobility. A higher knee voltage decreases the output power capability and reduces efficiency of the device. To make the matter worse, with an envelope tracking power supply or average power tracking power supply, when the supply voltage is low, the power signal can hit the knee voltage easily, causing linearity degradation in the device. The high knee voltage will cause a lower efficiency.

It is desirable to have a MOSFET device with high breakdown voltage and low knee voltage. In general, however, knee voltage increases with increasing breakdown voltage, and thus the two operating parameters are mutually exclusive to one another; that is, a high voltage device suffers from a higher knee voltage.

Embodiments of the LDMOSFET device shown in FIGS. 3-6 include a shielding structure 314, as previously described. This shielding structure 314, in one or more embodiments, can be used as a second gate which, in conjunction with the primary (RF) gate 310, is used to control one or more operating parameters and/or modes of the LDMOSFET device. Specifically, a novel LDMOSFET device configurable for operation in at least two modes will be described. In a first mode of operation, the LDMOSFET device is configured to operate with high drain voltages (e.g., about 10 volts) to thereby achieve higher output power, higher output impedance and lower matching loss, among other benefits. In a second mode of operation, the LDMOSFET device exhibits a reduced knee voltage when operated with low voltages, and achieves improved efficiency compared to the first mode.

The second gate 314, in one or more embodiments, is used to control an operational mode of the LDMOSFET device. More particularly, for operation in a first mode, which may be considered a high-voltage mode, the second gate 314 is connected to ground, shielding the RF gate 310 over the channel. With the second gate 314 biased at ground, hot carrier injection is significantly reduced since the electric field strength in the vicinity of a corner of the RF gate 310 proximate the drain extension region 304 is reduced. With the shielding function of the second gate 314, the LDMOSFET device exhibits a high breakdown voltage reliability (e.g., 20-30 volts).

For operation in a second mode, which may be considered a low-voltage mode, the second gate 314 is positively biased (i.e., by applying a positive voltage potential to the second gate) relative to the source of the LDMOSFET device, for an N-type device. For a P-type LDMOSFET device, the second gate 314 is negatively biased (i.e., by applying a negative voltage potential to the second gate) relative to the source of the device. In this second mode of operation of the LDMOSFET device, the drain voltage is low as is the overall electric field, and thus hot carrier injection is not a concern; knee voltage is a more critical factor in this scenario. By positively (or negatively, as the case may be) biasing the second gate 314, an accumulation of carriers in the LDD (drain extension) region 304 is introduced, thereby substantially reducing the knee voltage of the LDMOSFET device. An efficiency of the device is increased in this low-power mode of operation since the linear current range is increased.

Figure 7:
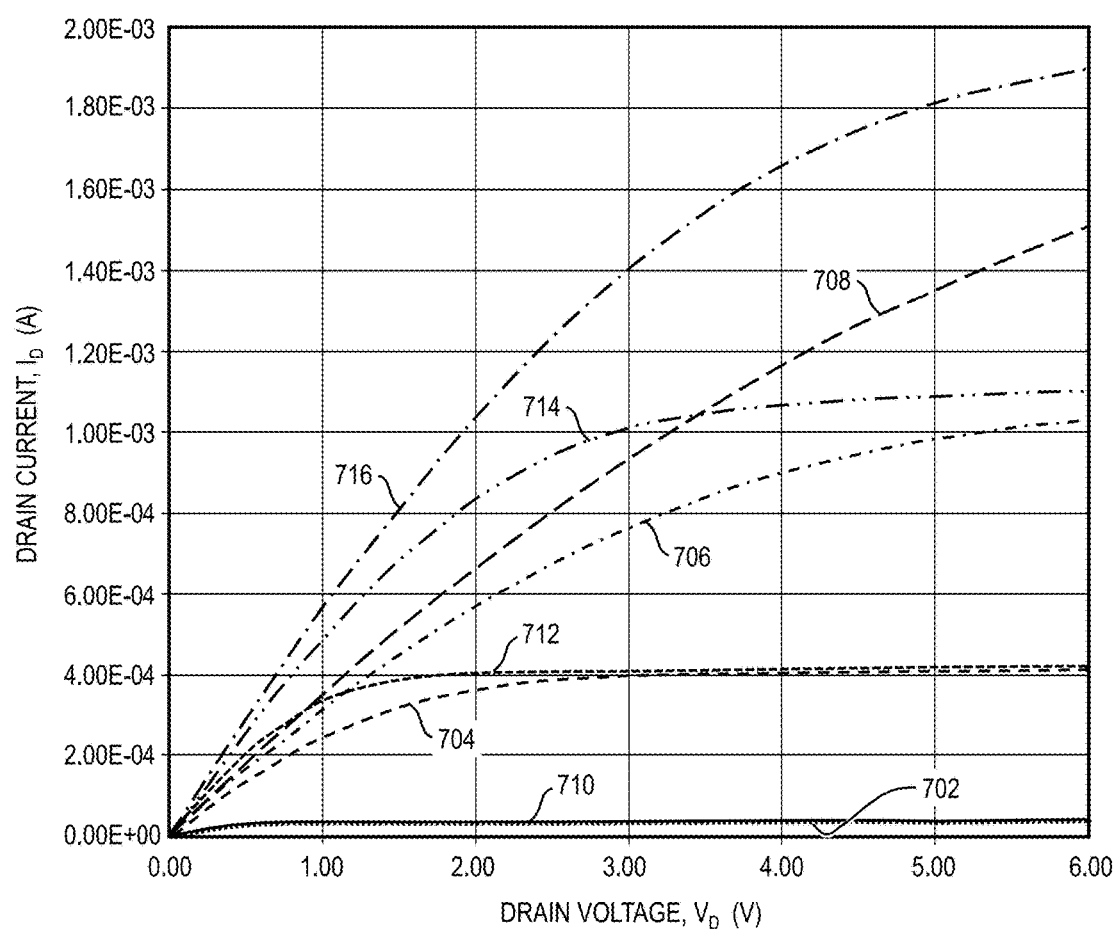
FIG. 7 is a graph including illustrative waveforms which conceptually depict the effects of biasing a second gate of an active power semiconductor device, according to embodiments of the invention.

By way of example only and without limitation, FIG. 7 is a graph including various illustrative waveforms which conceptually depict the effects of biasing the second gate 314 of the LDMOSFET device, according to embodiments of the invention. Specifically, the waveforms depict drain current as a function of drain voltage for various applied gate biasing scenarios of the LDMOSFET device. In this example, waveforms 702, 704, 706 and 708 depict drain current as a function of drain voltage for gate-to-source voltages of 2.0 volts (V), 2.5 V, 3.0 V and 3.5 V, respectively, applied to the first gate with the second gate biased at ground, and waveforms 710, 712, 714 and 716 depict drain current as a function of drain voltage for gate-to-source voltages of 2.0 volts (V), 2.5 V, 3.0 V and 3.5 V, respectively, applied to the first gate with the second gate biased at 3.5 V. As apparent from FIG. 7, when the second gate is positively biased there is a reduction in the knee voltage of the LDMOSFET device due, at least in part, to an accumulation of carriers in the LDD region, thereby increasing the device efficiency.

Figure 8:
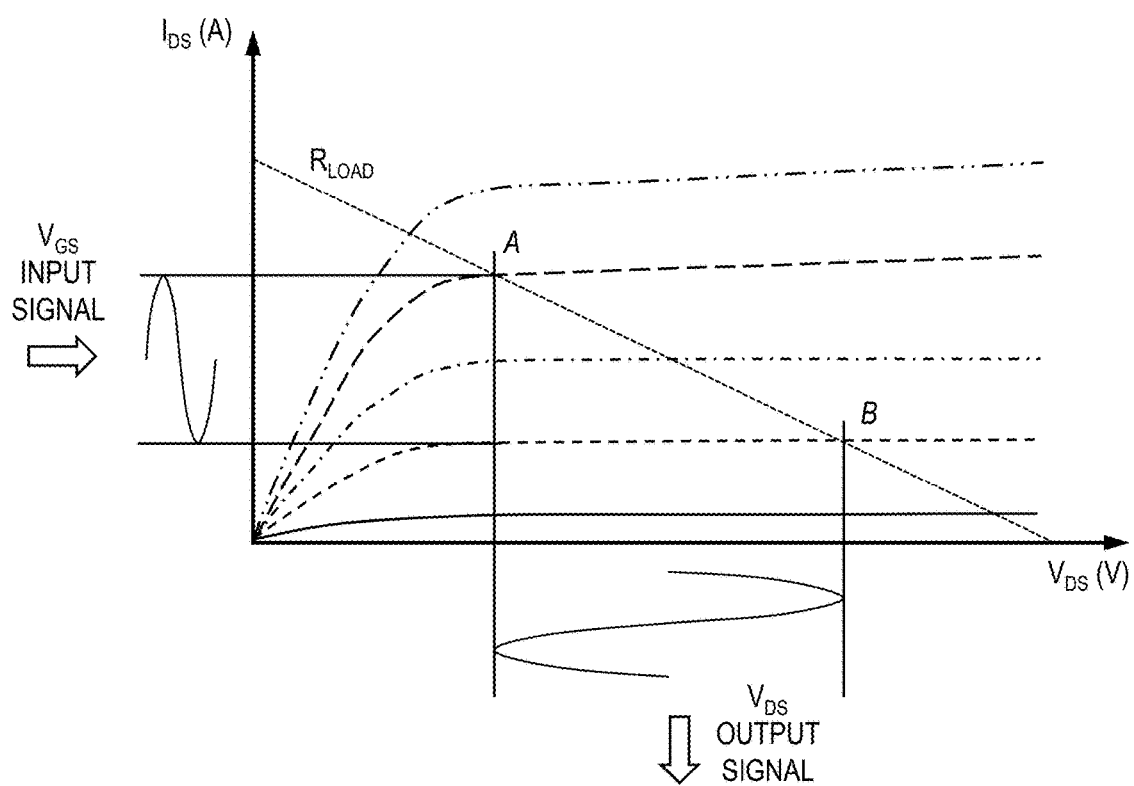
FIG. 8 is a schematic diagram of an exemplary equivalent circuit of an active power semiconductor device and integrated passive inductor showing parasitic impedance associated with a field plate of the active power semiconductor device connected to ground, according to an embodiment of the invention.

Specifically, FIG. 8 is a graph conceptually illustrating a manner in which knee voltage affects the functional range and efficiency of an LDMOSFET device. In the context of a power amplifier application, the LDMOSFET device amplifies a small input signal, $V_{GS}$, to generate a larger output signal, $V_{DS}$. By projecting the maximum and minimum amplitude points of the input signal (i.e., peak-to-peak amplitude values) onto the graph at points A and B, respectively, a line representing load resistance, $R_{LOAD}$, connecting points A and B can be drawn and used to determine the functional range of the LDMOSFET device without signal distortion (i.e., a linear range of the device). A lower knee voltage leads to a larger A-B range; that is, higher current and larger output voltage swing. Furthermore, since output power, $P_{OUT}$, can be determined by multiplying output current and output voltage (i.e., $P_{OUT}=I_{OUT}*V_{OUT}$), an increase in output current and/or output voltage yields higher power efficiency.

Although a field plate (e.g., shielding structure 314) is effective in shielding the MOSFET gate from the drain potential, the field plate itself can be affected by the drain through parasitic capacitance between the drain electrode and field plate. This effect may be referred to as field plate induced impedance.

However, even when the field plate is connected to ground, the connecting wires result in inevitable parasitic inductance and resistance between the field plate and ground. Under operation at RF frequencies, this parasitic impedance causes undesired potential variation on the field plate and may even introduce parasitic oscillation, hence noise, in the circuit. This effects worsens with increased frequency of operation. Consequently, it is advantageous to reduce the parasitic impedance and noise associated with the field plate.

Figure 9:
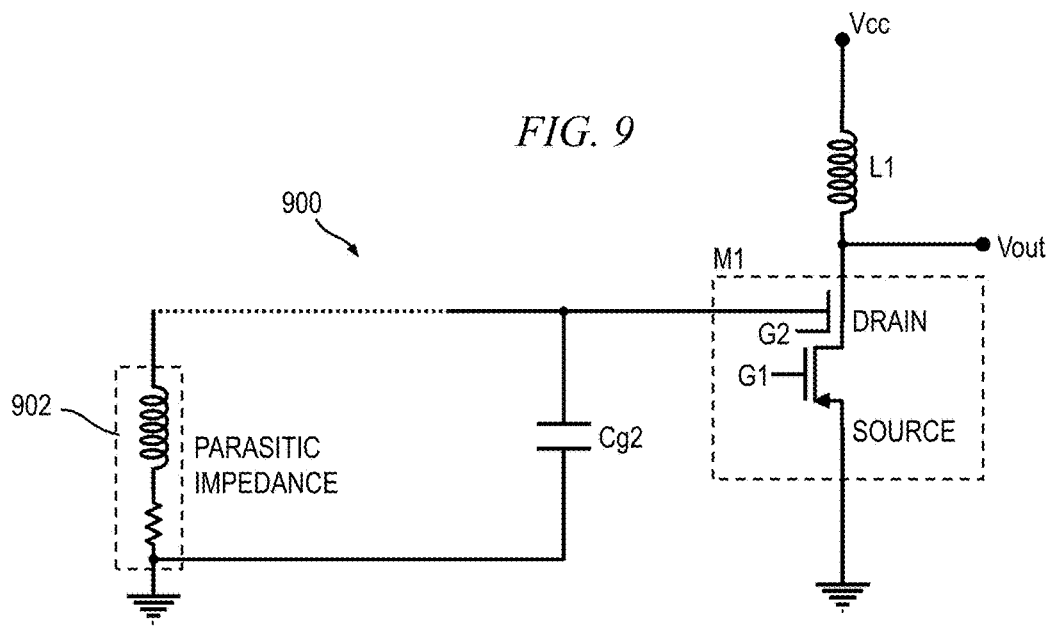
FIG. 9 is the top plan view depicting at least a portion of an exemplary semiconductor structure including an active power semiconductor device having multiple gates and including a source bypass capacitor fabricated as a parallel-plate capacitor disposed over a source region of the active device, according to an embodiment of the invention.

FIG. 9 is a schematic diagram of at least a portion of an exemplary equivalent circuit 900 of the LDMOSFET device, M1, and integrated inductor, L1, showing parasitic impedance 902 (represented as an inductor and series resistor) associated with the LDMOSFET device having a field plate (e.g., shielding structure 314) connected to ground, according to an embodiment of the invention. In this illustrative embodiment, a source bypass capacitor, Cg2, is connected in parallel with the parasitic impedance 902 of the field plate. A capacitance of the source bypass capacitor Cg2 is tuned (i.e., adjusted), in one or more embodiments, to significantly reduce or cancel the parasitic impedance 902 associated with the shielding structure 314. The integrated inductor L1, according to one or more embodiments, further enhances the effects of biasing the shielding structure/field plate 314 by shorting the parasitic RF noise associated with the parasitic impedance 902 of the shielding structure directly to ground, thereby beneficially achieving a more stable bias condition for the LDMOSFET device.

Figure 10:
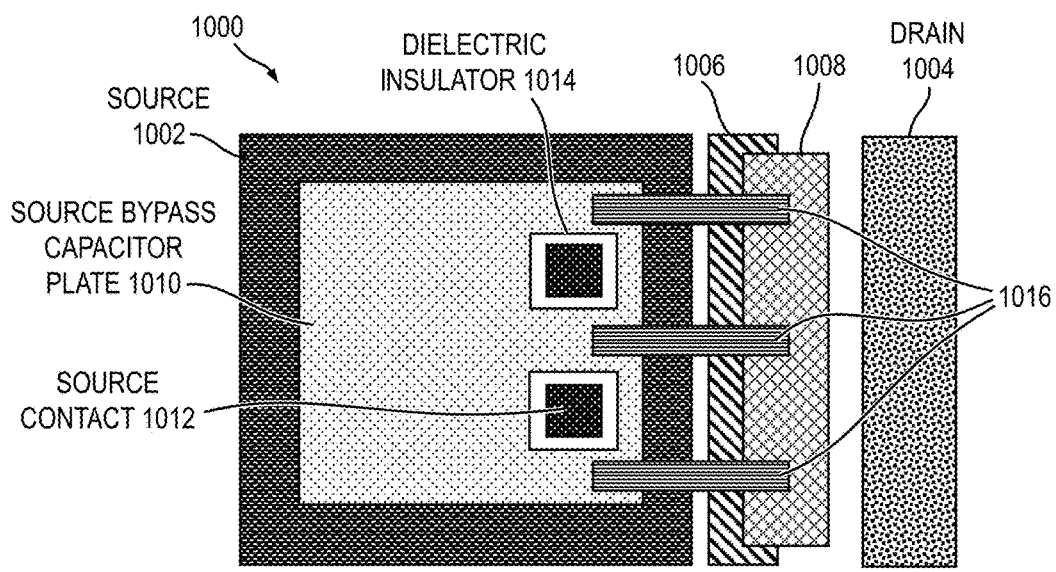
FIG. 10 is a cross-sectional view depicting at least a portion of an exemplary semiconductor structure including an active power semiconductor device, including a source bypass capacitor, and a passive inductor, according to an embodiment of the invention.

FIG. 10 is the top plan view depicting at least a portion of an exemplary semiconductor structure 1000 including an active power semiconductor device having multiple gates and including a source bypass capacitor fabricated as a parallel-plate capacitor disposed over a source region of the active device, according to an embodiment of the invention. With reference to FIG. 10, the semiconductor structure 1000 includes an LDMOSFET device formed in a manner consistent with the exemplary LDMOSFET device shown in FIG. 6, comprising a silicided source region 1002, a drain region 1004, a first gate 1006, which in this embodiment is a primary (e.g., RF) gate, and a second gate 1008, which in this embodiment is a shielding structure (e.g., field plate) formed in a manner consistent with the shielding structure 314 shown in FIGS. 3-6. The LDMOSFET device further comprises an integrated source bypass capacitor, represented as capacitor Cg2 in FIG. 9. A top parallel plate 1010 of the source bypass capacitor is disposed above at least a portion of the source 1002 of the LDMOSFET device, which forms a bottom plate of the source bypass capacitor (Cg2 in FIG. 9). The top plate 1010 is electrically insulated from the source 1002 by a dielectric insulating layer (e.g., 326 shown in FIG. 6). In one or more embodiments, the top plate 1010 is disposed within a boundary of the top plan area of the source 1002 so that it does not consume any additional die area.

One or more source contacts 1012 are formed through the top parallel plate 1010 of the source bypass capacitor and electrically connect to the underlying source region 1002. In this illustrative embodiment, two source contacts 1012 are shown, although embodiments of the invention are not limited to any particular number and/or size of the contacts. In order to electrically isolate the top plate 1010 from the source contacts 1012, so as to prevent the top and bottom plates of the source bypass capacitor from electrically shorting to one another, an insulating layer 1014 is formed on vertical sidewalls of the source contacts. One or more conductive wires 1016 are formed which electrically connect the top plate 101 with the second gate 1008. These conductive wires 1016 are electrically isolated from the source region 1002 and the first gate 1006 by an insulating/dielectric layer (e.g., 326 shown in FIG. 6). The conductive wires 1016, in one or more embodiments, are formed of metal, although essentially any low-resistance material (e.g., polysilicon, etc.) can be used.

Figure 11:
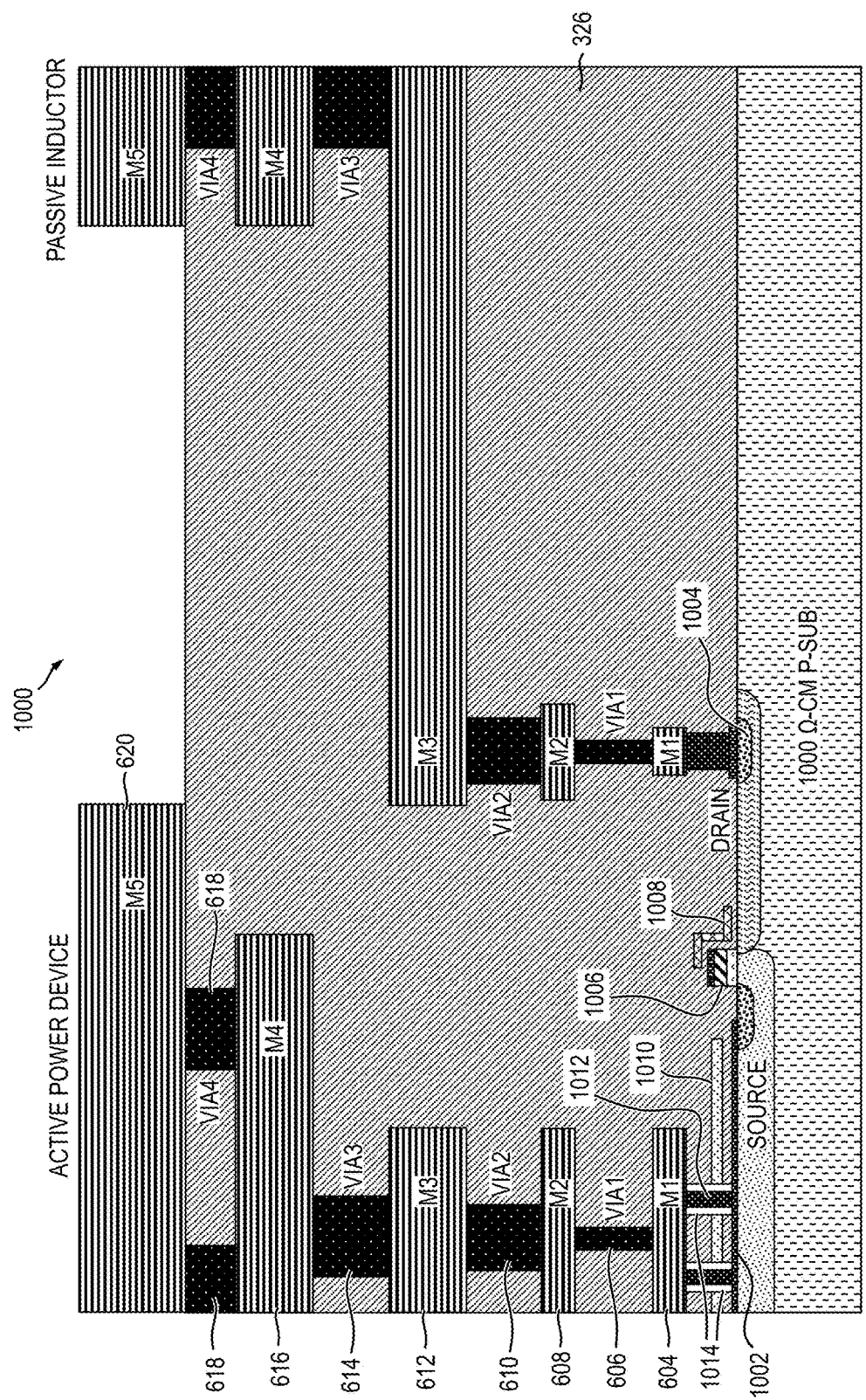
FIG. 11 is a cross-sectional view depicting at least a portion of an exemplary semiconductor structure including an active power semiconductor device and passive components integrated on both the top and back surfaces of a wafer, according to an embodiment of the invention.

FIG. 11 is a cross-sectional view depicting at least a portion of the exemplary semiconductor structure 1000. An arrangement of the source bypass capacitor comprising the top plate 1010, the source region 1002 acting as the bottom plate, and the dielectric insulating layer 326 formed therebetween, are clearly shown. The source contacts 1012 and sidewall insulating layer 1014 are also shown passing through the top plate 1010 of the source bypass capacitor. As previously stated, the capacitance of the source bypass capacitor is preferably configured to reduce or cancel the parasitic impedance associated with the second gate 1008. The capacitance of the source bypass capacitor can be adjusted, in one or more embodiments, by modifying one or more properties of the capacitor, including, for example, an area (e.g., planar area) of the top plate 1010, an area of the source plane 1002 serving as the bottom plate, and/or the type of material used to form the dielectric insulating layer 326 disposed between the top plate and source plane; the capacitance of the source bypass capacitor will be a function of a dielectric constant of the material forming the insulating layer.

FIG. 11 further illustrates the connection of the integrated passive inductor, formed on the upper surface of the wafer, with the drain of the LDMOSFET device, in a manner consistent with the illustrative semiconductor structure 600 shown in FIG. 6. The conductive wires 1016 shown in FIG. 10 have been omitted from FIG. 11 merely for clarity purposes; however, a connection between the top plate 1010 of the source bypass capacitor and the second gate 1008 is implied.

In the context of a power amplifier application, a power amplifier generally requires passive components to form proper input and/or output impedance matching circuits. Input and output impedance matching is particularly beneficial for maximizing power transfer between the power amplifier and external circuitry connected thereto, thereby improving performance and efficiency of the amplifier circuit. In standard practice, the inductors are placed outside of the silicon die, either on the front, side or back of the silicon. The connecting wires are generally routed through the upper surface of the silicon resulting in significant parasitic inductance, which lowers amplifier stability, gain and also reduces efficiency. As a consequence, there is a substantial benefit to bringing the passive components, such as inductors, as close as possible to the active devices, with the best approach being to integrate the passive components (e.g., inductors) on the same die as the active devices (e.g., LDMOSFETs).

In a CMOS process, the windings of a spiral inductor are separated from the substrate by a layer of dielectric material, such as, for example, silicon dioxide ($SiO_2$). This creates capacitance between the spiral wires and the surface of the substrate, as previously stated. In most modern CMOS processes, the substrate is a heavily doped P-type material and is tied to ground potential. Thus, the substrate appears as a grounded resistor in series with this capacitance. This substrate capacitance has at least two detrimental effects on a monolithic inductor: (i) it allows RF currents to interact with the substrate, thus lowering the inductance of the inductor; and (ii) it increases parasitic capacitances, thereby reducing the Q value of the inductor. Reducing the trace width can decrease this capacitance, but this, in turn, will increase the series resistance of the inductor. This is an important tradeoff since wide traces are generally used in inductors on silicon to overcome the low thin-film conductivity of the metallization. This also limits the feasibility of creating arbitrarily large-valued inductances. Thus, in a standard CMOS process, substrate losses ultimately remain a limiting factor, but these substrate losses are alleviated, at least somewhat, by the high-resistivity substrate 202, according to one or more embodiments.

In the exemplary embodiments shown in FIGS. 4-6 and 10, the integrated passive inductor was formed on the upper surface of the substrate. For example, when employing a passive inductor in an input matching network connected to the source of the LDMOSFET device, the wiring used to connect the source to the upper surface of the substrate can add significant parasitic impedance. In such a scenario, as an alternative approach to forming integrated inductors on the upper surface of the substrate, one or more inductors can be formed on the back side of the wafer, according to one or more embodiments of the invention. An inductor formed on the back side of the substrate substantially reduces the length of wiring needed to connect the integrated inductor to the source of the LDMOSFET device, thereby decreasing parasitic impedance in the device.

Figure 12:
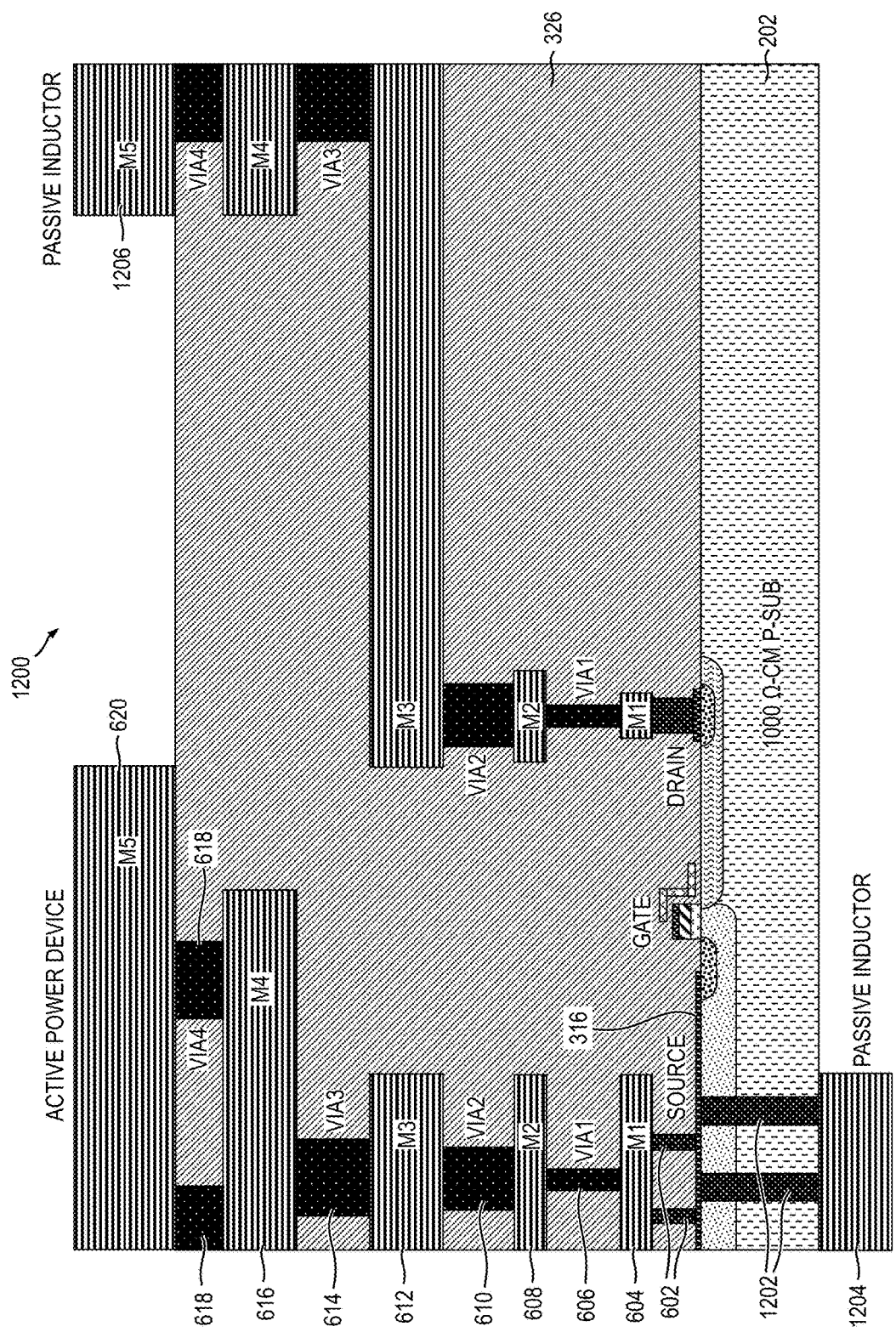
FIG. 12 is a cross-sectional view depicting at least a portion of an exemplary semiconductor structure including an active power semiconductor device and passive components integrated on both the upper surface and back side of a wafer/substrate, according to an embodiment of the invention.

By way of example only and without limitation, FIG. 12 is a cross-sectional view depicting at least a portion of an exemplary semiconductor structure 1200 including an active power semiconductor device (e.g., LDMOSFET device) and passive components (e.g., inductors) integrated on both the upper surface and back side of the wafer/substrate, according to an embodiment of the invention. Specifically, after forming an electrical connection 1202 with the silicide layer 316 of the source region, which may be implemented by forming (e.g., etching) one or more trenches through the silicon substrate 202 and refilling the trenches with conductive material in manner consistent with the formation of the source connection shown in FIGS. 4 and 5, a layer of epoxy (e.g., about 5-μm thick), or an alternative dielectric material (not explicitly shown, but implied), is first coated on at least a portion of the back side of the silicon substrate 202. Then, using a standard photolithography patterning process, trenches can be formed in the epoxy layer in the shape of a spiral (in the context of a spiral inductor), or other shape. A conductive material, preferably a metal such as copper, is deposited into the trenches to form the windings of a back-side passive inductor 1204.

In this embodiment, the passive inductor 1204 is disposed directly under, rather than laterally adjacent to, the power LDMOSFET device so as to reduce the length of the connection to the silicide layer 316 of the source region. One key advantage of this approach over existing practices is the significantly shorter wiring distance between the inductor 1204 and the LDMOSFET device, as previously stated. Conventionally, inductors are placed outside of the silicon die, usually aside, with the connecting wire formed through the upper surface of the silicon substrate, resulting in increased parasitic impedance (e.g., inductance and resistance).

FIG. 12 further depicts an integrated passive inductor 1206 formed on the upper surface of the substrate. The inductor 1206 formed on the upper surface of the substrate, in this embodiment, is electrically connected to the drain of the LDMOSFET device in a manner consistent with the connection between the passive inductor and LDMOSFET device shown in FIGS. 5 and 6. This inductor 1206 may be used as a blocking inductor or in an output impedance matching circuit of the semiconductor structure 1200, in one or more embodiments.

Given the discussion thus far, it will be appreciated that, in general terms, an exemplary method of integrating at least one passive component and at least one active power device on a same substrate includes: forming a substrate having a first resistivity value associated therewith; forming a low-resistivity region having a second resistivity value associated therewith in the substrate, the second resistivity value being lower than the first resistivity value; forming the at least one active power device in the low-resistivity region; forming an insulating layer over at least a portion of the at least one active power device; and forming the at least one passive component on an upper surface of the insulating layer above the substrate having the first resistivity value, the at least one passive component being disposed laterally relative to the at least one active power device and electrically connected with the at least one active power device.

Given the discussion thus far, it will also be appreciated that an exemplary semiconductor device includes at least one active device, such as an LDMOSFET, and at least one passive component, such as, for example, an inductor, integrated on the same substrate, in accordance with the exemplary methods described herein.

Given the discussion thus far, it will further be appreciated that a semiconductor structure for facilitating the integration of at least one active device and at least one passive component comprises at least one active power device, the active power device including a substrate of a first conductivity type, source and drain regions of a second conductivity type formed in the substrate, the source and drain regions being spaced laterally from one another, a first gate disposed above at least a portion of the substrate, between the source and drain regions, and a second gate disposed at least partially over the first gate and electrically insulated from the first gate. The second gate is configured to control an operational mode of the active power device. The semiconductor structure further includes an integrated capacitor including top and bottom parallel plates. A source plane overlying at least a portion of the source region and electrically connected therewith forms the bottom plate. The top plate is formed as a conductive structure disposed above at least a portion of the source plane and electrically insulated from the source plane by a dielectric layer formed over the source plane. The top plate is electrically connected with the second gate.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having active semiconductor devices integrated with passive components in accordance with one or more embodiments of the invention.

An integrated circuit in accordance with aspects of the present disclosure can be employed in essentially any application and/or electronic system where high-frequency power semiconductor devices (e.g., RF power amplifiers) are employed. Suitable systems and devices for implementing embodiments of the invention may include, but are not limited to, portable electronics. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. §1.72 (b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A method of integrating at least one passive component and at least one active power device on a same substrate, the method comprising:
    forming a substrate having a first resistivity value and a first conductivity type associated therewith;
    forming a low-resistivity region having a second resistivity value and the first conductivity type associated therewith directly in the substrate, without an intervening region of a different conductivity type, the second resistivity value being lower than the first resistivity value;
    forming the at least one active power device in the low-resistivity region;
    forming an insulating layer over at least a portion of the at least one active power device; and
    forming the at least one passive component on an upper surface of the insulating layer above the substrate having the first resistivity value, the at least one passive component being disposed laterally relative to the at least one active power device and electrically connected with the at least one active power device.

2. The method of claim 1, wherein the at least one passive component comprises a passive inductor.

3. A method of integrating at least one passive component and at least one active power device on a same substrate, the method comprising:
    forming a substrate having a first resistivity value associated therewith;
    forming a low-resistivity region having a second resistivity value associated therewith in the substrate, the second resistivity value being lower than the first resistivity value;
    forming the at least one active power device in the low-resistivity region;
    forming an insulating layer over at least a portion of the at least one active power device; and
    forming the at least one passive component on an upper surface of the insulating layer above the substrate having the first resistivity value, the at least one passive component being disposed laterally relative to the at least one active power device and electrically connected with the at least one active power device;
    wherein the active power device comprises a laterally-diffused metal oxide semiconductor (LDMOS) device, the method further comprising:
    forming source and drain regions of the LDMOS device in the low-resistivity region, the source and drain regions being spaced laterally from one another;
    forming a first gate disposed above at least a portion of the low-resistivity region, between the source and drain regions; and
    forming a second gate at least partially over the first gate and electrically insulated from the first gate, the second gate being configured to control an operational mode of the LDMOS device.

4. The method of claim 3, further comprising:
    in a first mode of operation of the LDMOS device, biasing the second gate to ground potential, wherein in the first mode, the LDMOS device is configured to operate with higher drain voltages compared to operation in a second mode, to thereby achieve higher output power, higher output impedance and lower matching loss; and
    in the second mode of operation, positively biasing the second gate with respect to ground potential for an N-type LDMOS device, or negatively biasing the second gate with respect to ground potential for a P-type LDMOS device, wherein in the second mode, the LDMOS device is configured to exhibit a reduced knee voltage when operated with lower voltages, compared to operation in the first mode, to thereby achieve increased efficiency compared to the first mode.

5. The method of claim 3, further comprising:
    forming an integrated capacitor including top and bottom parallel plates, a source plane overlying at least a portion of the source region and electrically connected therewith forming said bottom plate, said top plate being formed as a conductive structure disposed above at least a portion of the source plane and electrically insulated from the source plane by a dielectric layer formed over the source plane, the top plate being electrically connected with the second gate.

6. The method of claim 5, further comprising adjusting a capacitance of the integrated capacitor so as to substantially cancel a parasitic impedance associated with the second gate.

7. The method of claim 5, wherein said conductive structure forming the top plate of the integrated capacitor is disposed within a boundary of a top plan area of the source plane.

8. The method of claim 5, further comprising:
    forming at least one source contact, the source contact passing through the conductive structure forming the top plate of the integrated capacitor and being electrically connected with the underlying source region; and
    forming an insulating layer on at least sidewalls of said at least one source contact, the insulating layer preventing an electrical short between the conductive structure and the source region.

9. The method of claim 3, further comprising:
    forming at least one connection through the substrate and the low-resistivity region and electrically connected with the source region; and
    forming at least a second passive component disposed on a back side of the substrate, the second passive component being electrically connected with the source region via the at least one connection.

10. A semiconductor structure comprising at least one active power device, the active power device comprising:
a substrate of a first conductivity type;
source and drain regions of a second conductivity type formed in the substrate, the source and drain regions being spaced laterally from one another;
a first gate disposed above at least a portion of the substrate, between the source and drain regions;
a second gate disposed at least partially over the first gate and electrically insulated from the first gate, the second gate being configured to control an operational mode of the active power device; and
an integrated capacitor including top and bottom parallel plates, a source plane overlying at least a portion of the source region and electrically connected therewith forming said bottom plate, said top plate being formed as a conductive structure disposed above at least a portion of the source plane and electrically insulated from the source plane by a dielectric layer formed over the source plane, the top plate being electrically connected with the second gate.

11. The semiconductor structure of claim 10, wherein in a first mode of operation of the active power device, the second gate is biased at ground potential such that the active power device is configured to operate with higher drain voltages, compared to operation in a second mode, and wherein in the second mode of operation, the second gate is positively biased with reference to ground potential such that the active power device exhibits a reduced knee voltage when operated with lower voltages, compared to operation in the first mode, the active power device achieving higher output power, higher output impedance and lower matching loss in the first mode compared to the second mode, and the active power device achieving increased efficiency in the second mode compared to the first mode.

12. The semiconductor structure of claim 10, wherein one or more properties of the integrated capacitor are configured such that a capacitance of the integrated capacitor substantially cancels a parasitic impedance associated with the second gate.

13. The semiconductor structure of claim 12, wherein the one or more properties of the integrated capacitor comprises at least one of an area of the conductive structure forming the top plate, an area of the source plane overlying at least a portion of the source region, and a type of material forming the dielectric layer formed over the source plane.

14. The semiconductor structure of claim 10, further comprising at least one source contact passing through the conductive structure forming the top plate of the integrated capacitor and being electrically connected with the underlying source region, the at least one source contact including an insulating layer formed on at least sidewalls of said at least one source contact, the insulating layer preventing an electrical short between the conductive structure and the source region.

15. The semiconductor structure of claim 10, further comprising:
an insulating layer formed on at least a portion of the active power device; and
at least one passive component formed on an upper surface of the insulating layer, the at least one passive component being disposed laterally relative to the active power device and electrically connected with the active power device.

16. The semiconductor structure of claim 10, further comprising at least one passive component formed on a back side of the substrate and electrically connected with the source region.

17. The semiconductor structure of claim 16, wherein the at least one active power device comprises a laterally-diffused metal oxide semiconductor (LDMOS) device and the at least one passive device comprises a passive inductor.

18. The semiconductor structure of claim 10, further comprising a low-resistivity region formed in the substrate proximate an upper surface of the substrate, the low-resistivity region having a resistivity associated therewith that is lower relative to a resistivity of the substrate, wherein the source and drain regions are disposed at least partially within the low-resistivity region.

19. The semiconductor structure of claim 18, wherein the resistivity of the substrate is about 200 ohms-centimeter ($\Omega$-cm) to about 10,000 $\Omega$-cm.

20. A semiconductor structure, comprising:
a substrate having a first resistivity value and a first conductivity type associated therewith;
a low-resistivity region having a second resistivity value and the first conductivity type associated therewith formed directly in the substrate, without an intervening region of a different conductivity type, the second resistivity value being lower than the first resistivity value;
at least one active power device formed in the low-resistivity region;
an insulating layer formed over at least a portion of the at least one active power device; and
at least one passive component formed on an upper surface of the insulating layer above the substrate having the first resistivity value, the at least one passive component being disposed laterally relative to the at least one active power device and electrically connected with the at least one active power device.

* * * * *